United States Patent
Stehle

(10) Patent No.: US 6,567,494 B2
(45) Date of Patent: May 20, 2003

(54) METHOD FOR DIVIDING THE FREQUENCY OF A CLOCK SIGNAL AND FREQUENCY DIVIDER CIRCUIT FOR IMPLEMENTING THE METHOD

(75) Inventor: Birgit Stehle, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/784,304

(22) Filed: Feb. 16, 2001

(65) Prior Publication Data

US 2001/0043665 A1 Nov. 22, 2001

(30) Foreign Application Priority Data

Feb. 18, 2000 (DE) .......................... 100 07 606

(51) Int. Cl.⁷ .............................................. H03K 21/00
(52) U.S. Cl. ............................................. 377/47; 377/48
(58) Field of Search ................................. 377/47, 48

(56) References Cited

U.S. PATENT DOCUMENTS 5,365,119 A    11/1994    Kivari ....................... 327/115
6,121,801 A  * 9/2000    Lee ............................. 327/115

FOREIGN PATENT DOCUMENTS

| EP | 54 105952 | 8/1979 |
| EP | 60 003228 | 1/1985 |
| EP | 63 076616 | 9/1986 |

OTHER PUBLICATIONS

Nagle, Jr. et al "An Introduction to Computer Logic" 1975, Prentice–Hall, p. 80.*
Intel Chip Specification of CHMOS Programmabel Interval Timer 82C54 Oct. 1994.

* cited by examiner

Primary Examiner—Margaret R. Wambach
(74) Attorney, Agent, or Firm—Staas & Halsey LLP

(57) ABSTRACT

To divide a clock signal, a clock pulse counter counting clock pulses of the clock signal is in each case alternately reset after passing through different count differences. In this process, a first signal and a second signal is formed, the logic state of which is in each case changed with the presence of a first or, respectively, second predetermined count of the clock pulse counter by a rising or, respectively, falling clock signal edge. A divided output clock signal is then generated by a logical operation on the first and the second signal.

19 Claims, 2 Drawing Sheets

METHOD FOR DIVIDING THE FREQUENCY OF A CLOCK SIGNAL AND FREQUENCY DIVIDER CIRCUIT FOR IMPLEMENTING THE METHOD

BACKGROUND OF THE INVENTION

1. Field of the Invention

The present invention is directed to a frequency divider and more particularly, to a frequency divider having a pulse duty factor of 1:1 at an odd dividing ratio.

2. Description of the Related Art

Clock signals of different frequency are frequently needed for clocking modern digital circuits. Such clock signals are generally derived from a reference clock signal by dividing its clock frequency. Depending on the dividing ratio, clock signals of quite different frequency can be generated in this manner.

The frequency of a clock signal is frequently divided by means of a clock pulse counter which is incremented by the pulses of the clock signal to be divided in order to be reset periodically when a predetermined final count has been reached in each case. A divided output clock signal can be formed, for example from the most significant bit of the current count. The frequency of the output clock signal is then lower than the frequency of the clock signal to be divided, by the factor of the final count.

The problem with this type of frequency division is, however, that with odd dividing ratios, the pulse duty factor of the divided output clock signal is not equal to 1:1. In this connection, the pulse duty factor is the ratio between the period of time in which the output clock signal is at a logic 1 level and the period of time in which the output clock signal is at a logic 0 level. However, many applications require an output clock signal with a pulse duty factor of 1:1. The deviation of the pulse duty factor of an output clock signal generated by means of the method described above deviates very greatly from the ideal value of 1:1, especially in the case of small odd dividing ratios such as 3 or 5.

SUMMARY OF THE INVENTION

It is the object of the present invention to specify a method for dividing the frequency of a clock signal by means of which an output clock signal having a predetermined pulse duty factor can be generated. In particular, it should be possible to generate an output clock signal having a pulse duty factor of 1:1 even at an odd dividing ratio. It is also the object of the invention to specify a frequency divider circuit for implementing the method according to the invention.

The above objects are achieved by a method including counting clock pulses of the clock signal by a clock pulse counter; alternating between resetting the clock pulse counter after passing through a first count different and resetting the clock pulse counter after passing through a different second count difference; forming a first signal, the logic state of which is changed by a rising clock signal edge when the clock pulse counter has a predetermined first count; forming a second signal, the logic state of which is changed by a falling clock signal edge when the clock pulse counter has a predetermined second count; and generating a divided output clock signal by a logical operation on the first signal and the second signal. The above objects are also achieved by a frequency divider circuit including storing a predetermined counter end value in a read/write register; and resetting the clock pulse counter as determined by a comparison of a current count of the clock pulse counter with the counter end value stored in the read/write register.

Dividing the frequency of a clock signal in accordance with the invention is done with the aid of a clock pulse counter counting the clock pulses of the clock signal, which counter which alternately runs through a first count difference, called A in the text which follows, and a different second count difference, called B in the text which follows. In this connection, count difference is the respective number of counted clock pulses after which the clock pulse counter is reset in each case. A respective count difference thus corresponds to the difference between a respective counter start value to which the clock pulse counter is reset, and a respective counter end value after which, when it has been reached, the clock pulse counter is reset again. Alternately running through different count differences can be achieved, for example, by alternately resetting the clock pulse counter to different counter start values from one counter end value which remains the same, or by resetting the clock pulse counter after different counter end values have alternately been reached, the counter start value remaining the same.

Using the clock pulse counter, a first signal and a second signal are formed, the logic state (0 or 1) of which is changed when a first or second count, in each case predetermined, of the clock pulse counter is present. A change in the state of the first signal is triggered by a risingEdge of the clock signal whilst a change in the state of the second signal is initiated by a falling clock signal edge. Since a logical initial state is assumed again after two successive state changes in both signals, the signal period of both signals is A+B clock periods in the simplest case, i.e. when the counter passes alternately through the first and the second count difference. From the first and the second signal, a divided output clock signal is derived by logically combining these signals. The output clock signal thus also exhibits a period of A+B clock periods. The dividing ratio of a clock frequency division according to the invention, i.e. the ratio between the period of the output clock signal and the clock period of the clock signal, is thus A+B in the aforementioned case.

The pulse duty factor of the output clock signal can be adjusted within wide limits by selecting the in each case predetermined count at which the first and, respectively, second signal changes its logic state and by selecting the logical combination of the first and second signal. In particular, a pulse duty factor of 1:1 can also be achieved with odd dividing ratios in a simple manner. This can be achieved, for example, by selecting B=A+1 resulting in an odd dividing ratio of A+B=2A+1 and by selecting both the first and the second predetermined count to be equal to the counter end value. The first and the second signal thus change their logic state during the same clock period and are thus offset in time with respect to one another by half a clock period. In the case where the first and the second signal are set to the logic state of 1 after the counter passes through the greater count difference B=A+1 in each case, and to the logic state of 0 after the counter passes through the smaller count difference A, an output clock signal having a pulse duty factor of 1:1 can be formed by a logical OR operation on the first and the second signal. If, in contrast, the first and second signal are set to 0 after the counter has passed through the greater count difference B=A+1, and to 1 after it has passed through the smaller count difference A, an output clock signal having a pulse duty factor of 1:1 can be formed by a logical AND operation on the first and the second signal.

According to an advantageous further development of the invention, a read/write register can be provided in which a predetermined counter end value and/or a predetermined counter start value and/or a predetermined first and/or second count can be stored. The dividing ratio and the pulse duty factor of the output clock signal of an existing frequency divider circuit according to the invention can thus be varied in a particularly simple manner by changing the register content.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

In the text which follows, an exemplary embodiment of the invention will be explained in greater detail with reference to the drawing, in which.

DETAILED DESCRIPTION OF THE INVENTION

Figure 1:
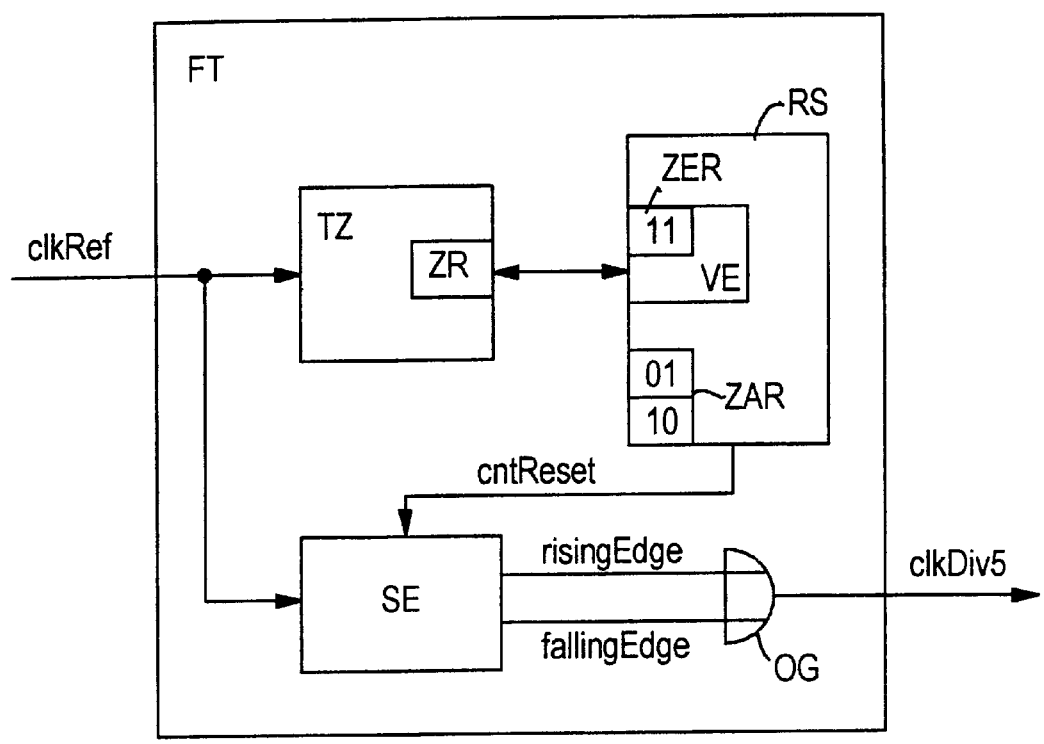
FIG. 1 shows a block diagram of a frequency divider circuit.

FIG. 1 diagrammatically shows a frequency divider circuit FT according to the invention which generates a divided output clock signal clkDiv5 from an input clock signal clkRef. The frequency of the output clock signal clkDiv5 is less than the frequency of the input clock signal clkRef by the odd divider factor of 5. The output clock signal clkDiv5 has a pulse duty factor of 1:1. The frequency divider circuit FT has as functional components a clock pulse counter TZ with a counting register ZR, a reset device RS connected to the clock pulse counter TZ, a signal generating circuit SE connected to the former and a logical OR gate OG, the two inputs of which are coupled to the signal generating circuit SE. The input clock signal clkRef is fed both to the clock pulse counter TZ and to the signal generating circuit SE and the divided output clock signal clkDiv5 is output at the output of the logical OR gate OG. The reset circuit RS, in turn, has a counter start value register ZAR and a comparison device VE with a counter end value register ZER. The counter start value register ZAR and the counter end value register ZER are constructed as read/write registers. In the present exemplary embodiment, the binary values 01 and 10 are stored in the counter start value register ZAR as counter start values and the binary value 11 is stored in the counter end value register ZER as counter end value.

In the text which follows, the interaction of the functional components will be explained with reference to a signal timing diagram shown in FIG. 2.

Figure 2:
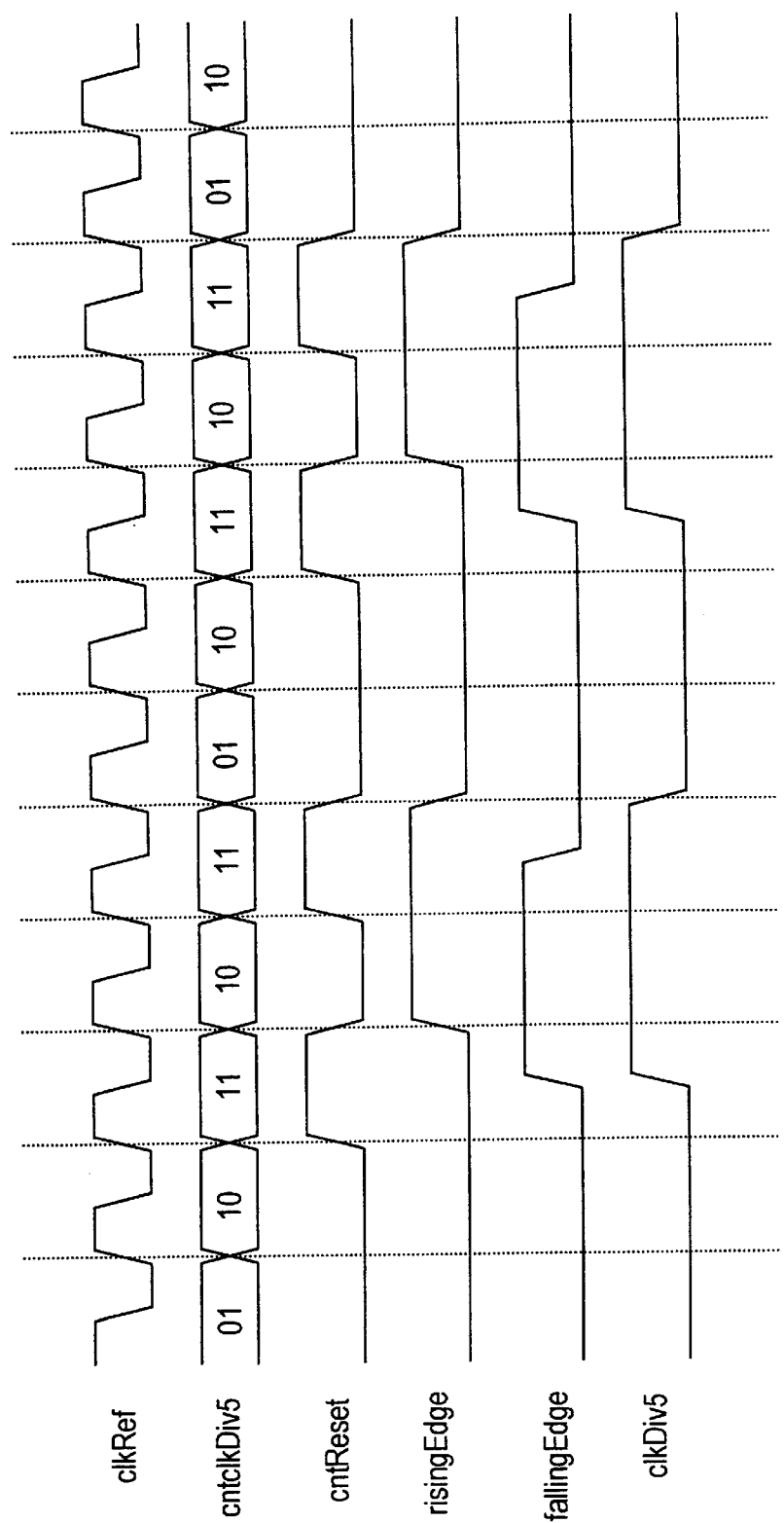
FIG. 2 shows a signal timing diagram of signals relevant to a frequency division.

FIG. 2 illustrates the variation of various signals contributing to the generation of the output clock signal clkDiv5 with time. The input clock signal clkRef predetermines for all signals shown a timing pattern which is indicated by dotted lines. The input clock signal clkRef is used by the clock pulse counter TZ for incrementing the counting register ZR from a respective start value, here alternately 01 and 10. The count cntclkDiv5 of the counting register ZR which can consist, for example, of cascaded flip-flop circuits, is incremented by 1 with each rising clock pulse edge of the clock signal clkRef. The count cntclkDiv5 is continuously compared with the counter end value 11 stored in the counter end value register ZER by the comparison device VE. When the counter end value 11 is reached, the comparison device VE initiates a reset of the counting register ZR by the resetting device RS. The counting register ZR is alternately reset to the counter start values 01 and 10 contained in the counter start value register ZAR. Thus, the count cntclkDiv5 of the counting register ZR periodically cycles through the binary values 01, 10, 11, 10 and 11.

Activated by the comparison device VE, the reset circuit RS generates a reset signal cntReset which assumes the logic state of 1 at the precise time when the count cntclkDiv5 of the counting register ZR matches the counter end value 11 stored in the counter end value register ZER. This reset signal cntReset is supplied by the reset device RS to the signal generating circuit SE which generates a first signal risingEdge and a second signal fallingEdge from the reset signal cntReset supplied and the clock signal clkRef supplied. Both signals risingEdge and fallingEdge are logically combined with the reset signal cntReset to the extent that they invert their logic state at the precise point in time when the reset signal cntReset has the logic state of 1. Such signal behavior can be implemented, for example, by means of a flip-flop circuit. The first signal risingEdge changes its logic state during a risingEdge of the clock signal clkRef whilst the second signal fallingEdge changes its logic state with a fallingEdge of the clock signal clkRef. Both signals are set to the logic state of 1 after the counter has passed through the greater count difference starting from counter start value 01 in each case and are reset to the logic state of 0 after the counter has passed through the smaller count difference starting from counter start value 10. The signals risingEdge and fallingEdge thus stay in the logic state of 1 for two clock periods of the clock signal clkRef and in the logic state of 0 for three clock periods, both signals being offset in time by half a clock period.

Both signals risingEdge and fallingEdge are supplied to the inputs of the logical OR gate OG which forms from these the divided output signal clkDiv5 by means of a logical OR operation on the signals risingEdge and fallingEdge. Due to the time offset of the signals risingEdge and fallingEdge, the output clock signal clkDiv5 generated by the logical OR operation on them stays in the logic state of 1 for 2½ clock periods and in the logic state of 0 also for 2½ clock periods and thus has a pulse duty factor of 1:1.

The frequency divider circuit FT can be configured in a simple manner for generating output clock signals having other divider ratios and/or other pulse duty factors by storing a different counter end value in the counter end value register ZER and/or other counter start values in the counter start register ZAR. Thus, storing a binary counter end value of 111 in the counter end value register ZER and the counter start values remaining 01 or, respectively, 10, produces a frequency division of the input clock signal clkRef with the dividing ratio of 13. The output clock signal generated in this case also has a pulse duty factor of 1:1.

In general, the frequency divider circuit FT of the present exemplary embodiment divides the frequency of an input clock signal clkRef by an odd divider ratio T which is given by: $T = 2*ZE - 1$ with a counter end value of ZE and the counter start values of 01 and 10. The pulse duty factor of each respective output clock signal is 1:1.

In the text which follows, an actual embodiment of a frequency divider circuit according to the invention is specified by means of the VHSIC hardware description language VHDL (VHSIC: Very High Speed Integrated Circuit) according to IEEE (IEEE: Institute of Electrical and Electronic Engineers) Standard:

```
-- ####################################################
-- #######Clock Divider ###############################
-- ####################################################
library IEEE, ARITHMETIC;
use IEEE.std_logic_1164.all;
use ARITHMETIC. std_logic_arith.all;
entity CLKD is
    port
    (
        clkRef : IN std_ulogic;
        pon : IN std_ulogic;
        clkDiv5        :    OUT std_ulogic
    );
end CLKD;
-- ####################################################
architecture RTL of CLKD is
    signal cntclkDiv5   : std_ulogic_vector(2 downto 0);
    signal cntReset     : std_ulogic;
    signal fallingEdge  : std_ulogic;
    signal risingEdge   : std_ulogic;
begin
--
++++++++++++++++++++++++++++++++++++++++++++
++++++++++++++++++++++++++++++++++
-- clkDiv5 clock divider (clkRef:5= clkDiv5)
--
++++++++++++++++++++++++++++++++++++++++++++
++++++++++++++++++++++++++++++++++
    ClkDiv5_counter : process (clkRef,pon)
    begin
        if (pon ='1') then
            cntclkDiv5 <= "001";
        elsif((clkRef' event) and (clkRef= '1')) then
            if (cntRset= '1') then
                cntclkDiv5 <== "001" + ("00" & fallingEdge);
            else
                cntclkDiv5 <== cntclkDiv 5 + ("001";
            end if;
        end if;
    end process clkDiv5_counter;
--
++++++++++++++++++++++++++++++++++++++++++++
++++++++++++++++++++++++++++++++++
    CntReset_gen : process (cntclkDiv5)
    begin
        if(cntclkDiv5= "111") then
            cntReset <= '1';
        else
            cntReset <= '0';
        end if;
    end process CntReset_gen;
--
++++++++++++++++++++++++++++++++++++++++++++
++++++++++++++++++++++++++++++++++
    FallingEdge_ff : process (clkRef, pon)
    begin
        if (pon = '1') then
            fallingEdge <= '0';
        elsif((clkRef'event) and (clkRef= '0')) then
            if (cntReset= '1') then
                fallingEdge <= not fallingEdge;
            end if;
        end if;
    end process fallingEdge_ff;
--
++++++++++++++++++++++++++++++++++++++++++++
++++++++++++++++++++++++++++++++++
    RisingEdge_ff : process (clkRef,pon)
    begin
        if(pon = '1') then
            risingEdge <= '0';
        elsif ((c/kRef'event) and (clkRef= '1') then
            if (cntReset = '1') then
                risingEdge <= not risingEdge;
            end if;
        end if;
    end process RisingEdge_ff;
--
++++++++++++++++++++++++++++++++++++++++++++
```

```
++++++++++++++++++++++++++++++++
    clkDiv5 <= risingEdge or fallingEdge;
--
+++++++++++++++++++++++++++++++++++++++++++++
++++++++++++++++++++++++++++++++++
END RTL;
```
The VHDL code specified and describing the frequency divider circuit can be used directly for automatically generating a chip layout for the frequency divider circuit. The VHDL code itself is independent of any technology to be used during the chip production.

What is claimed is:

1. A method for dividing the frequency of a clock signal, comprising:
   counting clock pulses of the clock signal by a clock pulse counter;
   alternating between resetting the clock pulse counter after passing through a first count difference and resetting the clock pulse counter after passing through a different second count difference;
   forming a first signal, the logic state of which is changed by a rising clock signal edge when the clock pulse counter has a predetermined first count;
   forming a second signal, the logic state of which is changed by a falling clock signal edge when the clock pulse counter has a predetermined second count; and
   generating a divided output clock signal by a logical operation on the first signal and the second signal.

2. The method as recited in claim 1, further comprising alternately resetting the clock pulse counter to different counter start values when a predetermined counter end value is reached.

3. The method as recited in claim 2, wherein at least one of the first predetermined count and the second predetermined count correspond to at least one of a predetermined counter end value and a predetermined counter start value.

4. The method as recited in claim 3, wherein said generating generates the divided output clock signal from the first signal and the second signal using at least one of a logical OR operation and a logical AND operation.

5. The method as recited in claim 4, further comprising:
   storing a predetermined counter end value in a read/write register; and
   resetting the clock pulse counter as determined by a comparison of a current count of the clock pulse counter with the counter end value stored in the read/write register.

6. The method as recited in claim 3, further comprising:
   storing a predetermined counter end value in a read/write register; and
   resetting the clock pulse counter as determined by a comparison of a current count of the clock pulse counter with the counter end value stored in the read/write register.

7. The method as recited in claim 2, further comprising:
   storing a predetermined counter end value in a read/write register; and
   resetting the clock pulse counter as determined by a comparison of a current count of the clock pulse counter with the counter end value stored in the read/write register.

8. The method as recited in claim 2, wherein said generating generates the divided output clock signal from the first signal and the second signal using at least one of a logical OR operation and a logical AND operation.

9. The method as recited in claim 1, wherein said generating generates the divided output clock signal from the first signal and the second signal using at least one of a logical OR operation and a logical AND operation.

10. The method as recited in claim 1, further comprising:
    storing a predetermined counter end value in a read/write register; and
    resetting the clock pulse counter as determined by a comparison of a current count of the clock pulse counter with the counter end value stored in the read/write register.

11. The method as recited in claim 1, further comprising resetting the clock pulse counter to a predetermined counter start value when alternating predetermined counter end values are reached which are different.

12. The method as recited in claim 11, wherein at least one of the first predetermined count and the second predetermined count correspond to at least one of a predetermined counter end value and a predetermined counter start value.

13. The method as recited in claim 12, wherein said generating generates the divided output clock signal from the first signal and the second signal using at least one of a logical OR operation and a logical AND operation.

14. The method as recited in claim 13, further comprising:
    storing a predetermined counter end value in a read/write register; and
    resetting the clock pulse counter as determined by a comparison of a current count of the clock pulse counter with the counter end value stored in the read/write register.

15. The method as recited in claim 12, further comprising:
    storing a predetermined counter end value in a read/write register; and
    resetting the clock pulse counter as determined by a comparison of a current count of the clock pulse counter with the counter end value stored in the read/write register.

16. The method as recited in claim 11, further comprising:
    storing a predetermined counter end value in a read/write register; and
    resetting the clock pulse counter as determined by a comparison of a current count of the clock pulse counter with the counter end value stored in the read/write register.

17. The method as recited in claim 11, wherein said generating generates the divided output clock signal from the first signal and the second signal using at least one of a logical OR operation and a logical AND operation.

18. A frequency divider circuit for dividing a clock signal, comprising
    a clock pulse counter for counting the clock pulses of the clock signal;

a reset circuit for alternately resetting the clock pulse counter after it has in each case passed through a first count difference and a resetting the clock pulse after passing through a different second count;

a signal generating circuit for forming a first signal with a logic state which changes with the presence of a predetermined first count of the clock pulse counter and a rising clock signal edge, and for forming a second signal with a logic state which changes with the presence of a predetermined second count of the clock pulse counter and a falling clock signal edge; and a logical gate circuit for logically combining the first signal and the second signal to form a divided output clock signal to be output.

19. The frequency divider circuit as recited in claim 18, further comprising:

a read/write register for storing a counter end value; and a comparison device for comparing a current count of the clock pulse counter with the stored counter end value and for resetting the clock pulse counter in the case of a positive result of the comparison.

* * * * *